United States Patent [19]

Iwahashi et al.

[11] Patent Number: 4,799,195
[45] Date of Patent: Jan. 17, 1989

[54] SEMICONDUCTOR MEMORY DEVICE WITH A SENSE AMPLIFIER

[75] Inventors: Hiroshi Iwahashi, Yokohama; Masamichi Asano, Tokyo, both of Japan

[73] Assignee: Kabushiki Kaisha Toshiba, Kawasaki, Japan

[21] Appl. No.: 168,560

[22] Filed: Mar. 4, 1988

Related U.S. Application Data

[63] Continuation of Ser. No. 822,205, Jan. 24, 1986, abandoned.

[30] Foreign Application Priority Data

Jan. 26, 1985 [JP] Japan .................................. 60-13069

[51] Int. Cl.$^4$ .............................................. G11C 11/40
[52] U.S. Cl. .................................... 365/185; 365/205; 365/210
[58] Field of Search ............... 365/185, 201, 205, 208, 365/210

[56] References Cited

U.S. PATENT DOCUMENTS

4,028,557  6/1977  Wilson ................................ 365/205
4,301,518  11/1981  Klass ................................... 365/185

OTHER PUBLICATIONS

Oto et al., "High-Voltage Regulation and Process Considerations for High-Density 5 V-Only E2PROM's", IEEE Journal of Solid-State Circuits, vol. SC-18, No. 5, Oct. 1983.

Primary Examiner—James W. Moffitt
Attorney, Agent, or Firm—Finnegan, Henderson, Farabow, Garrett & Dunner

[57] ABSTRACT

A semiconductor memory device comprises memory cell transistors each having a double layered gate having a floating gate and a control gate. The memory device comprises a transistor for receiving a predetermined voltage from a source external to the memory device and providing it as a reference voltage in response to a control signal, and a sense amplifier for comparing a voltage dependent on the data read from the memory cell with the reference voltage.

6 Claims, 4 Drawing Sheets

SEMICONDUCTOR MEMORY DEVICE WITH A SENSE AMPLIFIER

This application is a continuation, of application Ser. No. 822,205, filed Jan. 24, 1986, now abandoned.

BACKGROUND OF THE INVENTION

This invention relates to a semiconductor memory device with a sense amplifier.

In a semiconductor memory device, whether or not the data is reliably stored in each memory cell is an important matter. In the semiconductor memory device of the type in which transistors with floating gates are used for the memory cells, data of logical "1" is expressed in terms of a charged state of the memory cell. Specific ambient conditions, structural defects of the memory cell, etc. can often cause the discharge of stored electrons from the memory cell. Therefore, it is necessary to frequently check the charged or stored state of the cells, which determines the reliability of the stored data. The reliability of the stored data can also be described by the stability of the threshold voltage of the cell transistor. After a memory device is placed at a high temperature for a long period of time, if the threshold voltage of the cell transistors does not change, the stored data is reliable. In this respect, the reliability of the stored data can be known by checking the threshold values of the cell transistors.

FIG. 1 shows a conventional memory device provided with sense amplifier 20 for detecting data stored in cell transistor 11. Transistor 11 is of the type having a control gate Gc and a floating gate Gf. By injecting charges into the floating gate, data of "1" is stored in the cel. By discharging the cell, data of "0" is stored in the cell. If charges are injected into the discharged memory cell, the threshold value Vth of the cell changes from that in the discharged state. The first end of the source-drain path of cell transistor 11 is grounded. The second end of the path is connected to load circuit 12 with a voltage level changing function. Load circuit 12 is comprised of a couple of N channel MOS transistors 102 and 104, a couple of inverters 106 and 108, N channel MOS transistor 110, and N channel MOS transistor 112. Each of transistors 102 and 104 is connected with its source-drain path connected, at one end, to power source potential Vc, and, at the other end, to the second end of cell transistor 11 by input port Tin 12 of load circuit 12. Inverters 106 and 108 are connected between the second end of cell transistor 11 and the gates of transistors 102 and 104. The inverters each invert the logical level of the data from cell 11. Transistor 110 is connected with its drain-source path inserted between the second end of cell transistor 11 and output port Tout12 of load circuit 12, and with its gate connected to receive the output signal from inverter 108. One end of the drain-source path of MOS transistor 112 and its gate are connected together to power source voltage Vcc. The other end of the drain-source path is connected to the output port Tout12 of load circuit 12.

A dummy cell is further provided in this memory device. Transistor 13 constitutes the dummy cell, also having a double layered gate structure including floating gate Gf and control gate Gc. The dummy cell is not charged, with its threshold voltage set at its initial value. The drain-source of the transistor 13 is connected, at one end, to ground, while, at the other end, to the input port Tin14 of another load circuit 14 with a voltage level changing function. The circuit arrangement of this load circuit 14 is substantially equivalent to that of load circuit 12. This circuit 14 will be described, using the same reference numerals designating the same portions as those of load circuit 12.

Load circuit 14 is comprised of a couple of N channel MOS transistors 102 and 104, a couple of inverters 106 and 108, N channel MOS transistor 110, and N channel MOS transistor 112. Each of transistors 102 and 104 is connected so that its source-drain path is connected at one end to power source potential Vc, and at the other end to the second end of dummy cell transistor 13 through input port Tin14 of load circuit 14. Inverters 106 and 108 are connected between the second end of dummy cell transistor 13 and the gates of transistors 102 and 104. The inverters each invert the logical level of the data from cell 13. Transistor 110 is connected with its drain-source path inserted between the second end of cell transistor 13 and output port Tout14 of load circuit 14, and with its gate connected to receive the output signal from inverter 108. One end of the drain-source path of MOS transistor 112 and its gate are connected together to power source voltage Vc. The other end of the drain-source path is connected to the output port Tout14 of load circuit 14.

A voltage at the output Tout12 of circuit 12 is used for a voltage Vmem representing the data stored in the memory cell 11. A voltage at the output Tout14 of circuit 14 is used as a reference voltage Vref. The voltages are applied to sense amplifier 20. More specifically, they are applied to the gates of N channel MOS transistors 21 and 22 constituting the input circuit 23 of amplifier 20.

Sense amplifier 20 further comprises current mirror circuit 26, N channel MOS transistor 27, control signal generation circuit 28, and inverter 29. In input circuit 23, transistor 21 receives at its gate the output voltage of load circuit 12. Transistor 22 receives at its gate the output voltage of load circuit 14. Current mirror circuit 26 is made up of a pair of P channel transistors 24 and 25, which form a load circuit for input circuit 23. Transistor 27 renders input circuit 23 inactive during the inactive period of chip enable signal $\overline{CE}$. The circuit 28 generates a control signal for controlling transistor 27 in response to chip enable signal $\overline{CE}$. The sources of transistors 21 and 22 are both interconnected and grounded through the drainsource path of transistor 27. The drains of transistors 21 and 22 are both connected to power source potential Vc by the drain-source paths of transistors 24 and 25. The gate and drain of transistor 25 are interconnected. An interjunction between transistors 21 and 24 is connected to the input terminal of inverter 29. The data detected by sense amplifier 20 is supplied from this inverter 29.

Control signal generation circuit 28 comprises P channel MOS transistor 202, N channel MOS transistors 204 and 206 which are connected in series between potential Vc and ground GND, and N channel MOS transistor 208 coupled across transistor 206. Chip enable signal $\overline{CE}$ is connected to the gates of transistors 202 and 208. The gate and drain of transistor 204 are connected with each other, as is also the case for transistor 206. The drains of transistors 206 and 208 are both connected to the gate of transistor 27.

Bias circuit 30 is connected to the gate of dummy cell 13. Circuit 30 is made up of depletion type MOS transistor 31, and enhancement type MOS transistors 32 to 34. These transistors are connected in series between potential Vc and ground GND. When test signal T input to the gate of transistor 34 is at logical "1" level, bias circuit 30 provides a predetermined bias potential. The gates of transistors 31 and 32 are interconnected and further connected to a series connection point of transistors 31 and 32. This connection point is connected to the gate of transistor 13. Transistor 33 is connected i a diode fashion. A drive signal is supplied from a decoder (not shown) to the gate of memory cell 11.

The reliability of the stored data of cell 11, that is, the storage of charges in this cell, is ensured in the following way. Test signal T is set at "1" level. Thus, transistor 34 in bias circuit 30 is turned on. Therefore, applied to the gate Gc of dummy cell 13 is a bias voltage corresponding to the sum of the threshold voltages of transistors 32 and 33. At the same time, a "1" level voltage is applied to the gate Gc of the control gate of cell 11 by way of a decoder (not shown).

The power source voltage Vc is then progressively increased above the threshold voltage of cell 11. During this increase of voltage Vc, cell transistor 11 is turned on at an increated value of voltage Vc.

The threshold voltages VthC (memory cell 11), VthD(dummy cell 13), Vth32 and Vth33 of transistors 11, 13, 32 and 33 respectively, and power source potential Vc are related by the following relation (1).

$$Vc - VthC > Vth32 + Vth33 - VthD \ldots \quad (1)$$

When formula (1) holds, cell transistor 11 is turned on and the voltage corresponding to the data stored in cell 1 (the output voltage of load circuit 12) is smaller than reference voltage Vref, or the output voltage of load circuit 14. That is to say, when formula (1) holds, the data detected by sense amplifier 20 is inverted in level. The voltage Vc at this level inversion is expressed by Vc1.

Then, the memory device is subjected to a high temperature of 150° C. for a long time. Then, the above measurement of the device is again performed. In the measurement, potential Vc at the level insertion of the detected data is expressed by Vc2. A state that the potentials Vc1 and Vc2 are equal or substantially equal indicates that the reliability of the stored data of cell 11 is good. Value Vc2 smaller than Vc1 by a given value or more implies that floating gate Gf of cell 11 has been discharged. When this occurs, the reliability is low.

In a ROM of the type in which data is electrically written and erased by ultraviolet rays, the threshold voltage of the cell varies within a positive polarity region. Therefore, the above measurements are applicable to the reliability measurement of the ROM. In an EEPROM in which data write and erasure are both electrically made, when the cell is discharged by applying to high potential to the drain of the cell, the floating gate of the cell is positively charged, and hence the threshold voltage varies in the negative polarity region. The above measuring method is not applicable to the EEPROM. This is because if potential Vc is decreased within the positive polarity domain, the dummy cell is not turned off, and is kept in an on state. To turn off cell 11, potential Vc must be placed in the negative polarity region for the circuit to be operable. For this reason, the above measurement of the cell reliability is not available for a cell with the threshold voltage of negative polarity.

SUMMARY OF THE INVENTION

Accordingly, an object of this invention is to provide a semiconductor memory device using memory cells with their threshold voltage varying within the negative polarity domain, which memory device allows the measurement of the cell reliability.

According to the invention, there is provided a semiconductor memory device comprising a memory cell, a transistor for receiving a predetermined voltage from outside the chip and providing it as a reference voltage in response to a control signal, and a sense amplifier for comparing a voltage dependent on the data read from said memory cell with said reference voltage.

DETAILED DESCRIPTION OF THE PREFERRED EMBODIMENTS

Figure 1:
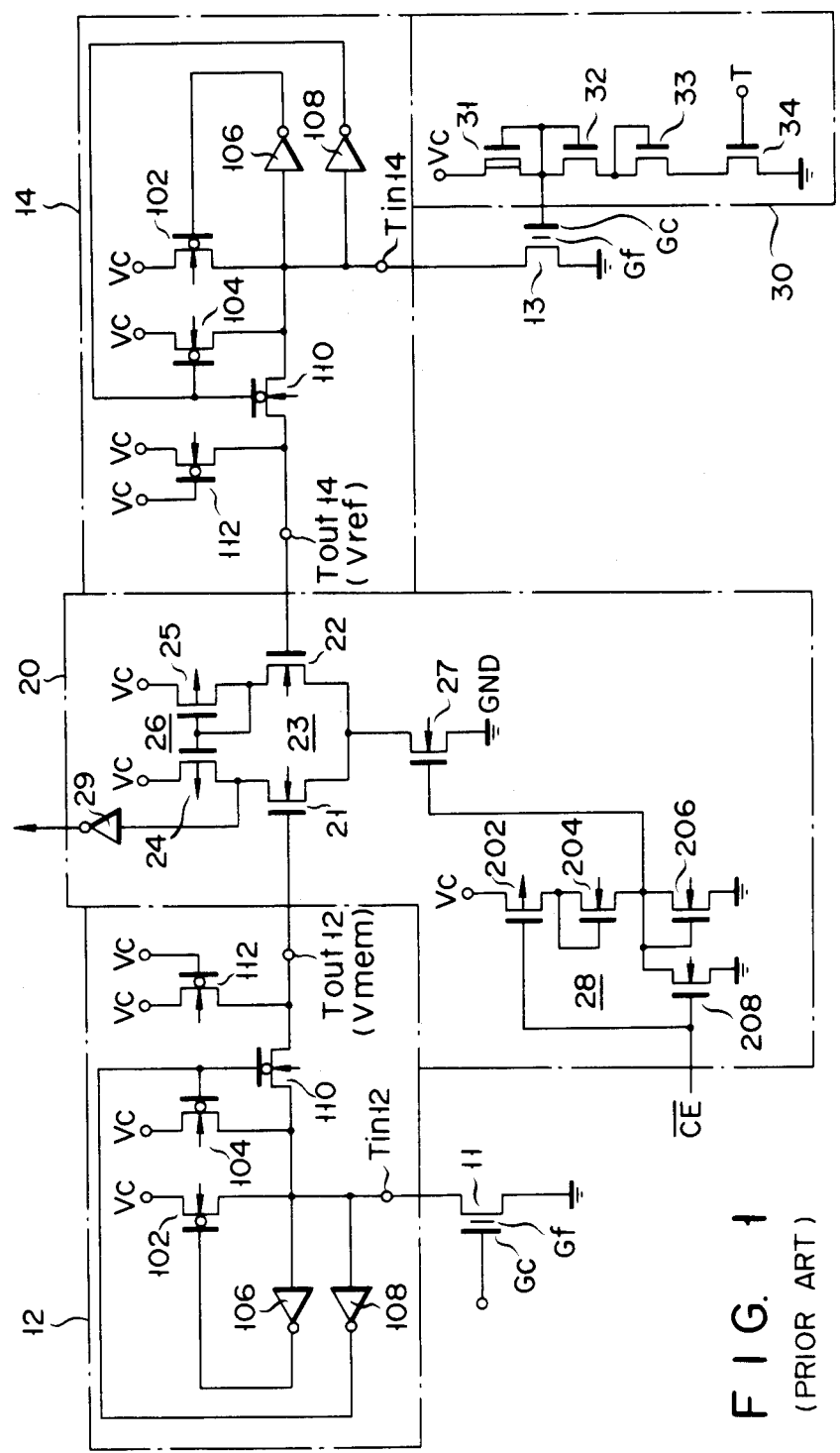
FIG. 1 is a circuit diagram of a conventional semiconductor memory device.
Figure 2:
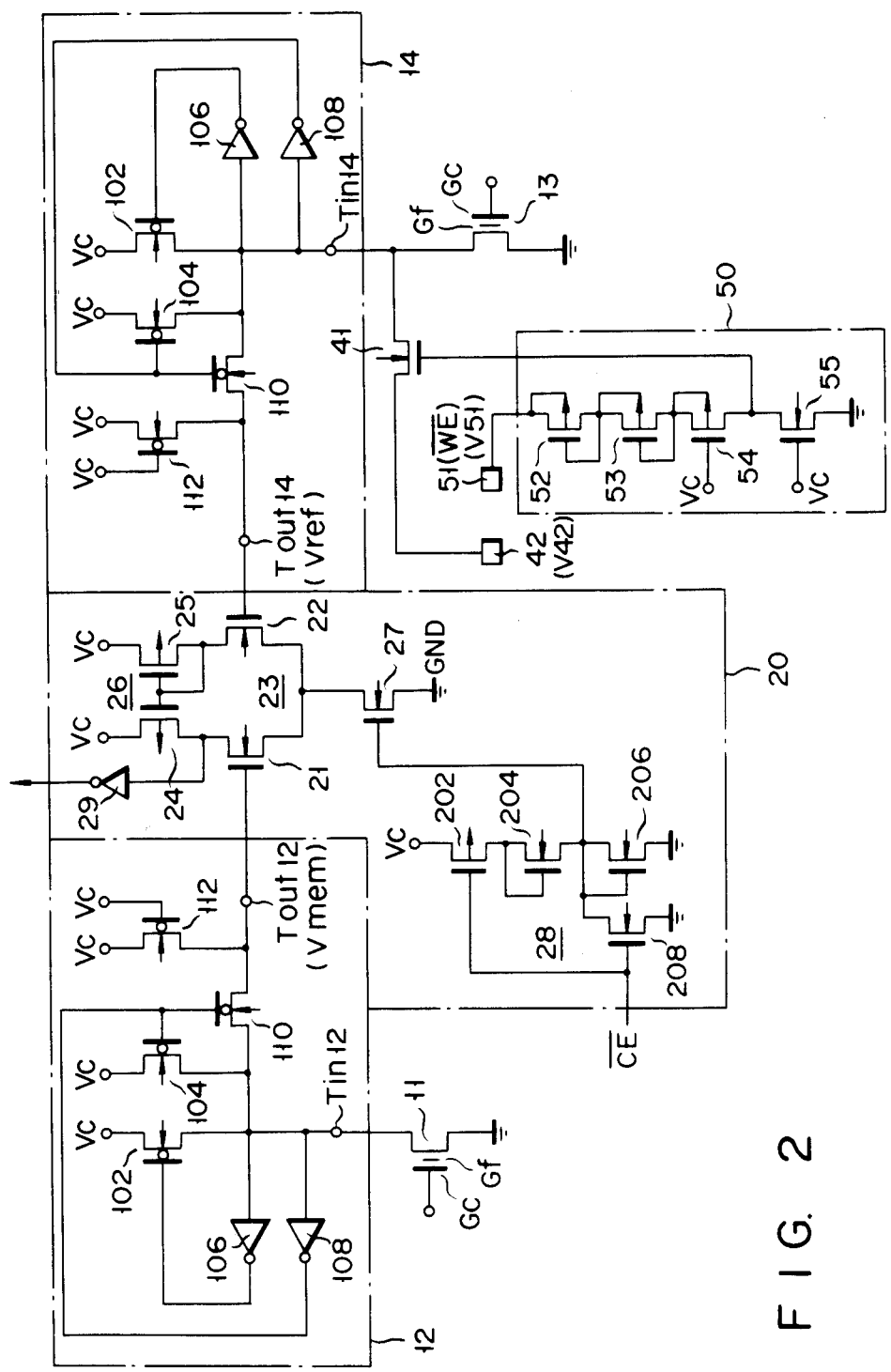
FIG. 2 is a circuit diagram of a semiconductor memory device according to an embodiment of the present invention.
Figure 3A:
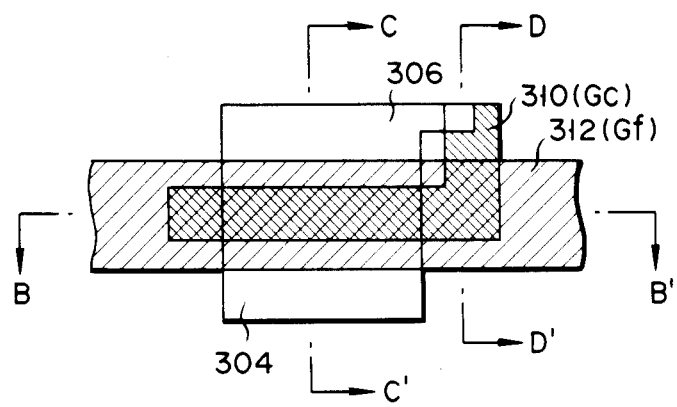
FIG. 3A shows a plan view of a MOS transistor with a floating gate nd a control gate.
Figure 3B:
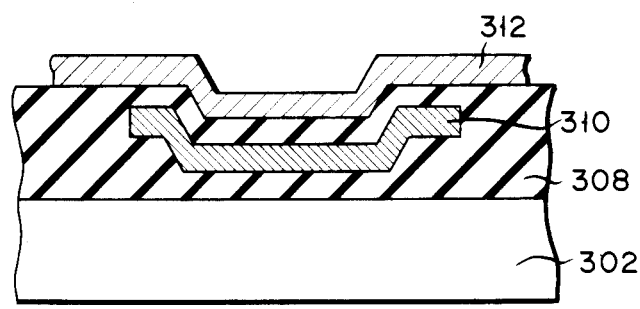
FIGS. 3B to 3D show cross sectional views of the transistor taken on lines B-B', D-D' in FIG. 3A.
Figure 3C:
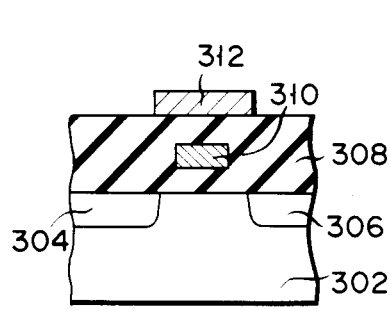
Figure 3D:
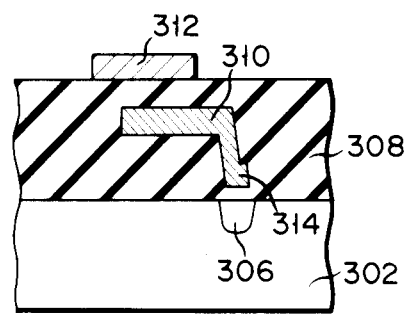

In FIG. 2, like reference numerals are used for designating like components in FIG. 1.

In FIG. 2, cell 11 is a MOS transistor whose the gate has a double layered structure including a control gate and a floating gate, as shown in FIGS. 3A to 3D.

As shown in these figures, a source region 304 and a drain region 306 are formed in silicon substrate 302 partially illustrated. Insulation film 308 is layered over substrate 302. Conductive layer 310 serving as floating gate Gf, which is electrically floating, is formed, in film 308, above the channel region between source region 302 and drain region 304. Metal layer 312 serving as control gate Gc is further formed on insulation film 308 on conductive layer 310. Layer 310 as floating gate Gf comprises a portion 314 projecting toward drain region 306. The distal end of projection 304 closes drain region 306, thereby allowing for effective injection and discharge of carriers to and from floating gate Gf.

To write data of "1" level into cell transistor 11, electrons are injected into the floating gate, rendering the threshold voltage Vth of the cell higher than the initial value. To write data of "0" level, electrons are discharged from the gate, so giving the threshold voltage a negative polarity. The source-drain path of cell 11 is connected at one end to ground GND, and at the other end to load circuit 12 as a voltage level changing circuit.

Load circuit 12 is comprised of a couple of N channel MOS transistors 102 and 104, a couple of inverters 106 and 108, N channel MOS transistor 110, and N channel MOS transistor 112. Each of transistors 102 and 104 is connected with its source-drain path connected, at one end, to power source potential Vc, and, at the other end, to the second end of cell transistor 11 by input port Tin12 of load circuit 12. Inverters 106 and 108 are connected between the second end of cell transistor 11 and the gates of transistors 102 and 104. These inverters invert the logical level of the data from cell 11. Transistor 110 is connected with its drain-source path inserted between the second end of cell transistor 11 and output port Tout12 of load circuit 12, and with its gate connected to receive the output signal from inverter 108. One end of its drain-source path of MOS transistor 112, and its gate are connected together to power source voltage Vc. The other end of the drain-source path is connected to the output port Tout14 of load circuit 14.

A dummy cell is further provided in this memory device. A transistor 13 constitutes the dummy cell, also having a double layered gate structure including floating gate Gf and a control gate Gc. The dummy cell is not charged with the threshold voltage set at its positive initial value close to 0 V. The drain-source of the transistor 13 is connected at one end to ground, while at the other end to the input port Tin14 of another load circuit 14 with a voltage level changing function. The circuit arrangement of this load circuit 14 is substantially equal to that of load circuit 12. This circuit 14 will be described, using the same reference numerals designating the same portions as those of load circuit 12.

Load circuit 14 is comprised of a couple of N channel MOS transistors 102 and 104, a couple of inverters 106 and 108, N channel MOS transistor 110, and N channel MOS transistor 112. Each of transistors 102 and 104 is connected with its source-drain path connected, at one end, to power source potential Vc, and, at the other end, to the second end of cell transistor 13 by input port Tin14 of load circuit 14. Inverters 106 and 108 are connected between the second end of cell transistor 13 and the gates of transistors 102 and 104. The inverters each invert the logical level of the data from cell 13. Transistor 110 is connected with its drainsource path inserted between the second end of cell transistor 13 and output port Tout14 of load circuit 14, and with its gate connected to receive the output signal from inverter 108. One end of its drain-source path of MOS transistor 112 and its gate are connected together to power source voltage $V_c$. The other end of the drain-source path is connected to the output port Tout14 of load circuit 14.

A voltage at the output Tout12 of circuit 12 is used for a voltage Vmem representing the data stored in the memory cell. A voltage at the output Tout14 of circuit 14 is used as a reference voltage Vref. The voltages are applied to sense amplifier 20. More specifically, they are applied to the gates of N channel MOS transistors 21 and 22 both constituting input circuit 23 of amplifier 20.

Sense amplifier 20 further comprises current mirror circuit 26, N channel MOS transistor 27, control signal generation circuit 28, and inverter 29. In input circuit 23, transistor 21 receives, at the gate, the output voltage of load circuit 12. Transistor 22 receives, at the gate, the output voltage of load circuit 14. Current mirror circuit 26 is made up of a pair of P channel transistors 24 and 25, which form a load circuit for input circuit 23. Transistor 27 renders input circuit 23 inactive during the inactive period of chip enable signal $\overline{CE}$. The circuit 28 generates a control signal for controlling transistor 27 in response to chip enable signal $\overline{CE}$. The sources of transistors 21 and 22 are interconnected and grounded through the drain-source path of transistor 27. The drains of transistors 21 and 22 are connected to power source potential $V_c$, through the drain-source paths of transistors 24 and 25. The gate and drain of transistor 25 are interconnected. An interjunction between transistors 21 and 24 is connected to the input terminal of inverter 29. The data detected by sense amplifier 20 is supplied from this inverter 29.

Control signal generation circuit 28 comprises P channel MOS transistor 202, N channel MOS transistors 204 and 206 connected in series between potential $V_c$ and ground GND, and N channel MOS transistor 208 coupled across transistor 206. Chip enable signal $\overline{CE}$ is connected t the gates of transistors 202 and 208. The gate and drain of transistor 204 are connected with each other. This is true for transistor 206. The drains of transistors 206 and 208 are connected to the gate of transistor 27.

The other end of dummy cell 13, which is connected to load circuit 14, is connected to the source of N channel MOS transistor 41. The drain of transistor 41 is coupled with external terminal 42. In a normal operation mode, or a read or write mode, chip enable signal $\overline{CE}$ is applied to external terminal 42. Bias circuit 50, which is different from bias, circuit 30 in FIG. 1, is connected to the gate of transistor 41. Bias circuit 50 is comprised of three P channel MOS transistors 52 to 54, and N channel MOS transistor 55. External terminal 51 is connected to bias circuit 50. In the normal operation mode, write enable signal $\overline{WE}$ (not shown), for example, is applied to terminal 51. The source-drain paths of transistors 52 to 54 are connected in series between external terminal 51 and the gate of transistor 41. The source-drain path of transistor 55 is inserted between the gate of transistor 41 and ground. The gates of transistors 52 and 53 are connected to the ends of the source-drain paths which are located farther away from external terminal 51. Power source potential Vc is applied to the gates of transistors 54 and 55.

In measuring the reliability of the memory cells, a proper voltage V42, not chip enable signal $\overline{CE}$, is applied to external terminal 42. A voltage V51 much higher than potential Vc, in place of write enable signal $\overline{WE}$, is applied to external terminal 51. By applying to terminal 51 high voltage V51 as a control signal, a high voltage is applied to the gate of transistor 41, so that a potential difference across the source-drain path of transistor 41 is reduced to approximately 0 V. The voltage applied to terminal 42 is directly applied to the other end of dummy cell 13, i.e. the terminal connected to load circuit 14.

It is assumed that the floating gate Gf of memory cell 11 is positively charged, and the threshold voltage of cell 11 is placed in the negative region. Under this condition, voltage V42 applied to external terminal 42 is gradually changed. With the gradual change of the applied voltage V42, the data detected by sense amplifier 20 is inverted in level. The value of voltage V42 causing the level inversion is designated as V42-1. Then, the memory device is left in a high temperature place for a long time, and again subjected, to an operation similar to the one described before. A value or voltage V42, which inverts the level of the detected data as it gradually increases, is designated as V42-2.

As the result of the measurement, if voltage values V42-1 and V42-2 are equal or substantially equal to each other, the reliability of cell 11 is good. If V42-2 is smaller than V42-1 by a predetermined value or more, carriers have been discharged from the floating gate Gf of memory cell 11. The latter case indicates poor reliability.

As described above, in the present invention, the voltage measured for reliability is voltage V42 applied to the junction between dummy cell 13 and input terminal Tin14 of load circuit 14, not power source voltage Vc which is the voltage used to determine reliability in the prior memory device shown in FIG. 1. With use of voltage V42, it is possible to measure reliability of memory cells of, for example, EEPROM, i.e. the memory device of the type in which the memory cells have negative threshold voltages.

In the case of programmable ROM in which data is written by an electrical manner, but erased by ultraviolet rays, the reliability measurement can be performed by varying power source voltage Vc, with the application of a fixed voltage to external terminal 42.

In this embodiment, terminals 51 and 42 for receiving the voltage signals for reliability measurement are also used as terminals for receiving write enable signal $\overline{WE}$ and chip enable signal $\overline{CE}$ in the normal operation mode, i.e. the write or the read mode. This connection eliminates the need for additional provision of terminals for voltage signals V42 and V51, and therefore simplifies the circuit arrangement of the memory device.

Figure 4:
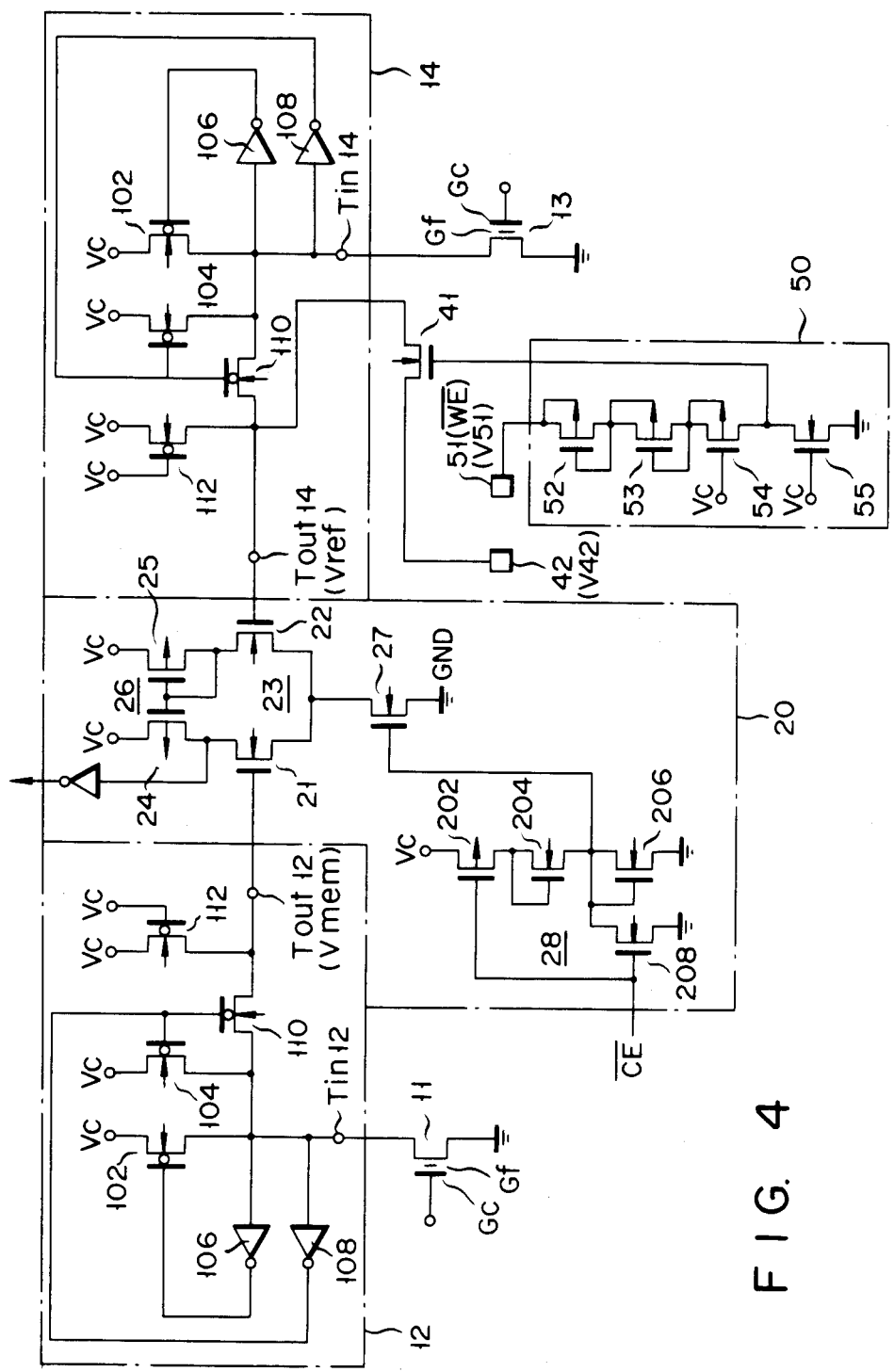
FIG. 4 is a circuit diagram of a semiconductor memory device according to another embodiment of the present invention.

FIG. 4 shows another embodiment of a memory device according to the present invention. In this embodiment, the source of transistor 41 is connected to the gate of transistor 22 in sense amplifier 20 (output terminal Tout14 of load circuit 14), not to the other end of dummy cell 13 (the terminal connected to load circuit 14). (In FIG. 2, the source of transistor 41 is connected to the other end of the dummy cell.) The above connection is the difference of this embodiment from the FIG. 2 embodiment. The remaining circuit arrangements of these embodiments are substantially equal.

This embodiment can measure the cell reliability in a similar manner to that of the FIG. 2 embodiment.

In measuring the reliability of the memory cell, a voltage, not chip enable signal $\overline{CE}$, is applied to external terminal 42. A voltage V51 much higher than potential Vc, in place of write enable signal $\overline{WE}$, is applied to external terminal 51. By applying to terminal 51 high voltage V51 as a control signal, a high voltage is applied to the gate of transistor 41 so that a potential difference across the source-drain path of transistor 41 is reduced to approximately 0 V. The voltage applied to terminal 42 is directly applied to the other end of dummy cell 13, i.e. the terminal connected to load circuit 14.

It is assumed that the floating gate Gf of memory cell 11 is positively charged, and the threshold voltage of cell 11 is placed in the negative region. Under this condition, voltage V42 applied to external terminal 42 is gradually changed. With the gradual change of the applied voltage V42, the data detected by sense amplifier 20 is inverted in level. The value of voltage V42 causing the level inversion is designated as V42-1. Then, the memory device is left in a high temperature place for a long time, and again subjected to an operation similar to the above one. A value of voltage V42, which inverts the level of the detected data as it gradually increases, is designated as V42-2.

As the result of the measurement, if these voltage values V42-1 and V42-2 are equal or substantially equal to each other, the reliability of cell 11 is good. If V42-2 is smaller than V42-1 by a predetermined value or more, carriers have been discharged from the floating gate Gf of memory cell 11. The latter case indicates poor reliability.

As described above, in this embodiment, the voltage applied to terminal 42 is directly applied to the gate of transistor 22 in sense amplifier 20, not by way of transistor 110 in load circuit 14. Therefore, this embodiment is free from the voltage drop across transistor 110, which is inevitable in the FIG. 2 embodiment. In this respect, the accuracy of data detection is improved.

As seen from the foregoing description, the present invention provides a semiconductor memory device which can measure the reliability of memory cells even if the cells contained have negative threshold voltage.

What is claimed is:

1. A semiconductor memory device comprising:
   a memory cell including a first MOS floating gate transistor, a predetermined voltage being applied to a drain-source path of said first transistor and a first control signal being applied to a gate of said first transistor;
   a dummy cell including a second MOS floating gate transistor, a predetermined reference voltage being applied to a drain-source path of said second transistor and a second control signal being applied to a gate of said second transistor;
   a third MOS transistor having a drain-source path thereof coupled to said dummy cell and to a voltage source, and having a gate thereof supplied with a third control signal, said third MOS transistor transferring said predetermined reference voltage from said voltage source to said dummy cell in response to said third control signal; and
   a sense amplifier for comparing a read out voltage from said memory cell with said predetermined reference voltage.

2. A semiconductor memory device according to claim 1, in which said sense amplifier comprises an input circuit including a pair of MOS transistors coupled with said voltage dependent on the read out data and said reference voltage, and a load circuit for said input circuit.

3. A semiconductor memory device according to claim 1, in which said memory cell comprises means for storing charges, said means being electrically floating.

4. A semiconductor memory device according to claim 1, further comprising bias circuit means for generating said third control signal and passing said third control signal to the gate of said third transistor, said gate turning on when said predetermined reference voltage is applied to said third transistor.

5. A semiconductor device according to claim 4, wherein said bias circuit includes a signal terminal for receiving a chip enable signal.

6. A semiconductor memory device according to claim 4, wherein said bias circuit includes a signal terminal for receiving a data write enable signal.

* * * * *